(12) United States Patent
Kawarada et al.

(10) Patent No.: US 12,378,691 B2
(45) Date of Patent: Aug. 5, 2025

(54) LAMINATE, SINGLE CRYSTAL DIAMOND SUBSTRATE AND METHOD OF PRODUCING SAME

(71) Applicant: WASEDA UNIVERSITY, Tokyo (JP)

(72) Inventors: Hiroshi Kawarada, Tokyo (JP); Wenxi Fei, Tokyo (JP); Aoi Morishita, Tokyo (JP)

(73) Assignee: WASEDA UNIVERSITY, Tokyo (JP)

( * ) Notice: Subject to any disclaimer, the term of this patent is extended or adjusted under 35 U.S.C. 154(b) by 343 days.

(21) Appl. No.: 18/042,725

(22) PCT Filed: Aug. 19, 2021

(86) PCT No.: PCT/JP2021/030346
§ 371 (c)(1),
(2) Date: Feb. 23, 2023

(87) PCT Pub. No.: WO2022/044946
PCT Pub. Date: Mar. 3, 2022

(65) Prior Publication Data
US 2023/0349070 A1  Nov. 2, 2023

(30) Foreign Application Priority Data
Aug. 26, 2020 (JP) .................. 2020-143009

(51) Int. Cl.
*C30B 25/18* (2006.01)
*C30B 29/04* (2006.01)

(52) U.S. Cl.
CPC .............. *C30B 25/18* (2013.01); *C30B 29/04* (2013.01)

(58) Field of Classification Search
CPC ....... C23C 16/27; C30B 25/18; C30B 25/183; C30B 29/04
See application file for complete search history.

(56) References Cited

U.S. PATENT DOCUMENTS 6,113,451 A * 9/2000 Hobart .................... H01J 9/025
445/24
2007/0084398 A1    4/2007 Schreck et al.
(Continued)

FOREIGN PATENT DOCUMENTS

JP       06212428 A  *  8/1994
JP       H06212428 A     8/1994
(Continued)

OTHER PUBLICATIONS

S. Yamada, et al. publication entitled "Rotational honeycomb epitaxy of Ru thin films on sapphire (0001) substrate," Jpn. J. Appl. Phys., vol. 41, pp. L206-L208 (2002). (Year: 2002).*
(Continued)

*Primary Examiner* — Jaehwan Oh
(74) *Attorney, Agent, or Firm* — Fox Rothschild LLP; Carol E. Thorstad-Forsyth (57) ABSTRACT

A stack includes: a ruthenium film; and a diamond film that is an epitaxial film formed on the ruthenium film, wherein a crystal plane of a surface of the ruthenium film is a (0001) plane, and a crystal plane of a surface of the diamond film is a (111) plane. A method of manufacturing a stack includes: a step of forming a ruthenium film; and a step of heteroepitaxially growing a diamond film on the ruthenium film, wherein a (111) plane of the diamond film is heteroepitaxially grown on a (0001) plane of the ruthenium film.

4 Claims, 9 Drawing Sheets

(56) References Cited

U.S. PATENT DOCUMENTS

2016/0115032 A1* 4/2016 Wodtke ................ C01B 32/188
                                                         205/291
2016/0208413 A1    7/2016 Nebel et al.

FOREIGN PATENT DOCUMENTS

| JP | 2005219962 A | 8/2005 |
| JP | 2016145144 A | 8/2016 |
| JP | 2020090408 A | 6/2020 |

OTHER PUBLICATIONS

International Search Report dated Oct. 12, 2021 issued in PCT/JP2021/030346.
Applied Physics Letters, vol. 117, Issue 11, 10.1063/5.0008287.
Epitaxial Growth of Diamond on Iridium, Ohtsuka, Jpn. J. Appl. Phys. vol. 35 (1996).
Growth of highly (111)-oriented, highly coalesced diamond films on platinum (111) surface: A possibility of heteroepitaxy, Shintani, Department of Electric and Electronic Engineering, Faculty of Engineering, The University of Tokushima, 2-1, Minami-josanjima-cho, Tokushima 770, Japan.

\* cited by examiner

LAMINATE, SINGLE CRYSTAL DIAMOND SUBSTRATE AND METHOD OF PRODUCING SAME

CROSS-REFERENCES TO RELATED APPLICATION

This application is a U.S. National Stage entry under 35 U.S.C. § 371 based on International Application No. PCT/JP2021/030346 which was filed on Aug. 19, 2021 and claims priority to Japanese Patent Application No. 2020-143009, which was filed on Aug. 26, 2020 and entitled "LAMINATE, SINGLE CRYSTAL DIAMOND SUBSTRATE AND METHOD OF PRODUCING SAME". The content of the priority applications are hereby incorporated herein in their entirety by reference.

TECHNICAL FIELD

The present invention relates to a stack, a single-crystal diamond substrate, and a method of manufacturing the same.

BACKGROUND ART

Diamond is expected as a semiconductor material suitable for a power device for large power that requires high voltage and large current operation. In order to industrialize diamond as a semiconductor material, development of a method capable of manufacturing a single-crystal diamond substrate having a large area at low cost is required. It has been proposed that a single-crystal diamond substrate is produced by using platinum (for example, NPTL 1) or iridium (for example, NPTL 2) as a base film and heteroepitaxially growing a diamond film on the base film.

CITATION LIST

Non Patent Literature

NPTL 1: Y. Shintani, Journal of materials research 11, 2955 (1996)
NPTL 2: K. Ohtsuka, K. Suzuki, A. Sawabe, and T. Inuzuka, Jpn. J. Appl. Phys. 35, L1072 (1996)

SUMMARY OF THE INVENTION

Technical Problem

However, a stack including a single-crystal diamond substrate having higher quality crystallinity is required. In addition, since platinum and iridium are expensive, there is a problem in that a single-crystal diamond substrate cannot be manufactured at low cost when platinum or iridium is used as a base film for heteroepitaxially growing a diamond film.

The present invention has been made in view of the above circumstances, and an object of the present invention is to provide a stack and a single-crystal diamond substrate, which can be manufactured with high quality and at low cost, and a method of manufacturing the same.

Solution to Problem

A stack of the present invention includes: a ruthenium film; and a diamond film that is an epitaxial film formed on the ruthenium film.

In addition, a single-crystal diamond substrate of the present invention includes: a ruthenium film; and a diamond film that is an epitaxial film formed on the ruthenium film.

Furthermore, a method of manufacturing a stack of the present invention includes: a step of forming a ruthenium film; and a step of heteroepitaxially growing a diamond film on the ruthenium film.

Furthermore, a method of manufacturing a single-crystal diamond substrate of the present invention includes: a step of forming a ruthenium film; and a step of heteroepitaxially growing a diamond film on the ruthenium film.

Advantageous Effects of the Invention

According to the present invention, by using ruthenium as a base film for heteroepitaxially growing a diamond film, it is possible to provide a stack and a single-crystal diamond substrate that can be manufactured at higher quality and lower cost than in a case where the base film is platinum or iridium, and a method of manufacturing the same.

DESCRIPTION OF EMBODIMENTS

Hereinafter, a configuration of a single-crystal diamond substrate 1 according to an embodiment of the present invention and a method of manufacturing the same will be described. As shown in a cross-sectional view of the single-crystal diamond substrate 1 in FIG. 1, the single-crystal diamond substrate 1 includes a sapphire base material 2, a ruthenium film 3 formed on the sapphire base material 2, and a diamond film 4 that is an epitaxial film formed on the ruthenium film 3. A crystal plane of a surface of the ruthenium film 3 is a (0001) plane of ruthenium, and the diamond film 4 is formed on the surface of the ruthenium film 3 by heteroepitaxial growth. A crystal plane of a surface of the diamond film 4 is a (111) plane.

Figure 1:
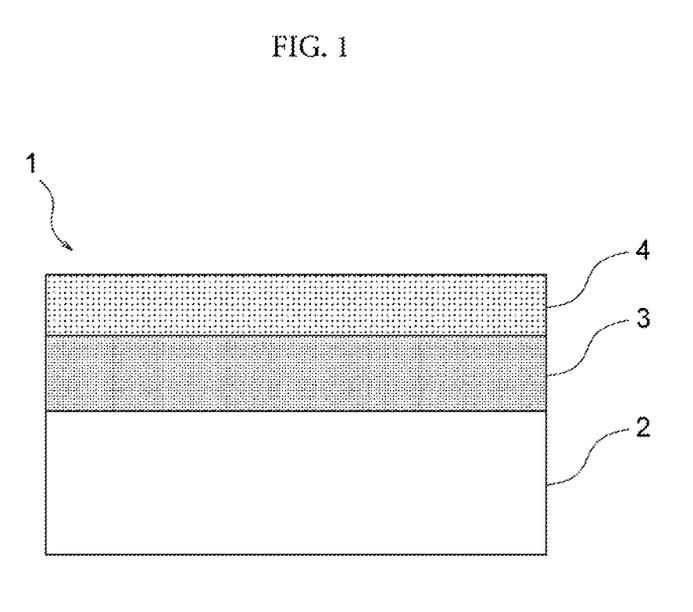
FIG. 1 A cross-sectional view showing a configuration of a single-crystal diamond substrate according to an embodiment of the present invention.

In this example, the sapphire base material 2 made of sapphire is used as the base material, but the base material is not limited thereto, and for example, a base material made of strontium titanate, magnesium oxide, or the like may be used. Alternatively, without using the sapphire base material 2, the ruthenium film 3 may have a thickness of, for example, 200 μm or more and be configured as a base material.

Next, a method of manufacturing the single-crystal diamond substrate 1 will be described.

First, the sapphire base material 2 is prepared. The sapphire base material 2 has a thickness of, for example, 200 μm or more and 600 μm or less. The sapphire base material 2 is preferably C-plane sapphire ($Al_2O_3$, (0001) plane).

Next, the ruthenium film 3, a surface of which is the (0001) plane, is formed on the sapphire base material 2 by a sputtering method. The thickness of the ruthenium film 3 is, for example, 50 nm or more and 300 nm or less. The surface of the ruthenium film 3 may be a crystal plane corresponding to a plane equivalent to the (0001) plane.

Subsequently, diamond is heteroepitaxially grown on the surface ((0001) plane) of the ruthenium film 3 by a plasma-enhanced chemical vapor deposition (plasma CVD) method to form the diamond film 4. The thickness of the diamond film 4 is, for example, 50 nm or more and 200 nm or less. The surface of the diamond film 4 that is an epitaxial film thus formed is the (111) plane. As conditions for the heteroepitaxial growth of the diamond film 4, for example, in a plasma CVD apparatus, two steps of nucleation on the ruthenium film 3 and subsequent epitaxial growth of the (111) plane are performed. In nucleation, carbon ions in raw material gas are attracted onto the surface of the ruthenium film 3 to generate diamond nucleus for growing the diamond film 4. Therefore, nucleation is preferably performed by setting the temperature to 600° C. or higher and 900° C. or lower and applying a substrate bias for collecting positive ions such as carbon ions in plasma in an atmosphere containing hydrogen and methane. It is preferable that the heteroepitaxial growth of the (111) plane performed subsequently to the nucleation is performed by setting the temperature to 600° C. or higher and 900° C. or lower and discharging plasma in an atmosphere containing hydrogen and methane.

Figure 2:
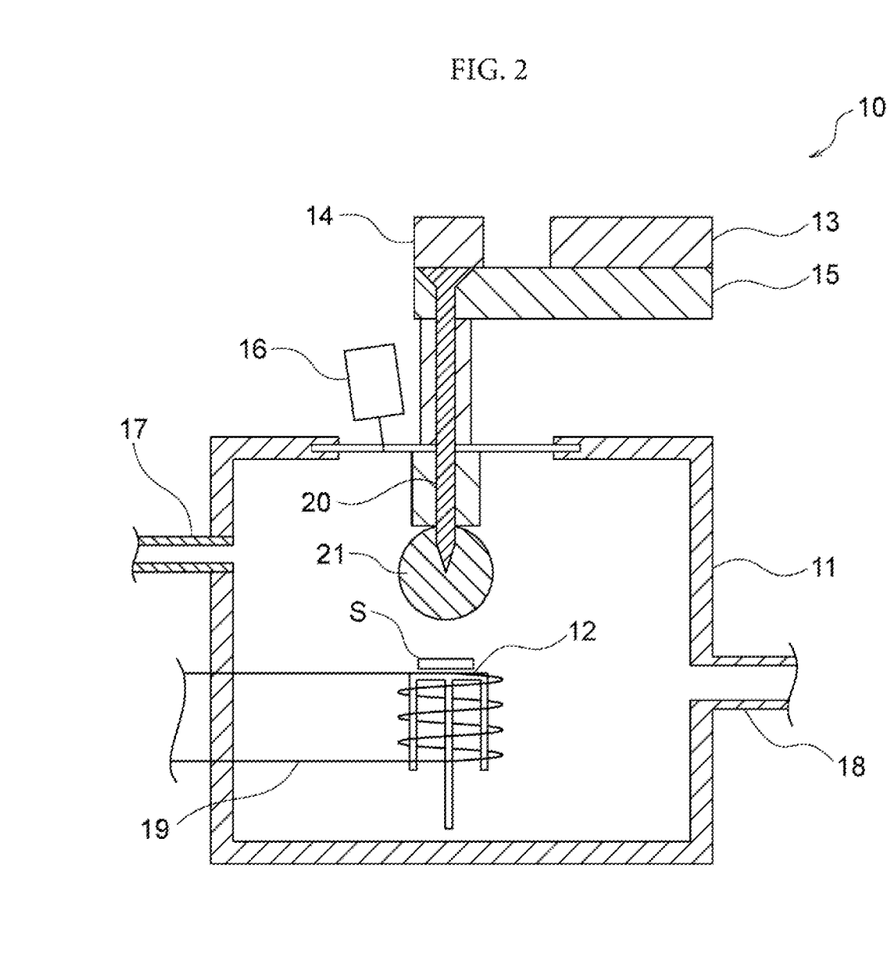
FIG. 2 An outline view showing a configuration of an MPCVD apparatus.

As an example of an apparatus used for the heteroepitaxial growth of the diamond film 4, a microwave excited plasma CVD (microwave plasma chemical vapor deposition, hereinafter referred to as MPCVD) apparatus 10 is shown in FIG. 2. The MPCVD apparatus 10 includes a chamber 11, a DC voltage applicable sample stage 12 (hereinafter referred to as a stage 12) on which an object S is placed, a magnetron generator 13 that generates microwaves, a waveguide converter 14, a waveguide 15, a temperature measuring device 16, a raw material gas supply path 17, a raw material gas exhaust path 18, an induction heating type coil 19, and an antenna electrode 20. The object S has the ruthenium film 3 formed on the surface of the sapphire base material 2.

The object S is fixed on the stage 12 by a clamp ring or the like in a direction in which the surface of the ruthenium film 3 faces upward, and is heated to a predetermined temperature by the induction heating type coil 19 provided in the stage 12. The temperature of the object S fixed on the stage 12 is monitored by the temperature measuring device 16 that is a non-contact type. Raw material gas containing hydrogen and methane is supplied from the raw material gas supply path 17 into the chamber 11, and microwaves are transmitted from the magnetron generator 13, whereby a plasma ball 21 is generated near the tip of the antenna electrode 20. The plasma ball 21 is held near the tip of the antenna electrode 20 without moving during a process. As a result, diamond is heteroepitaxially grown on the surface of the ruthenium film 3 using carbon in the raw material gas as a raw material, and the diamond film 4 having a surface that is the (111) plane is formed.

Figure 3:
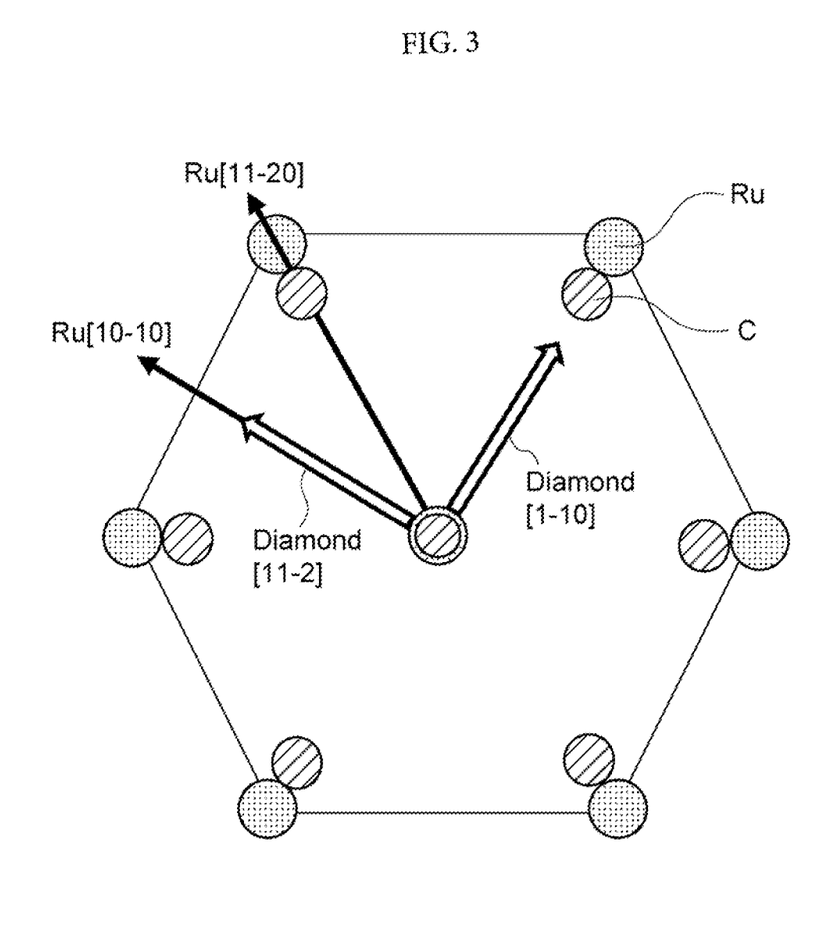
FIG. 3 A schematic view showing crystal lattices of a diamond (111) plane and a ruthenium (0001) plane.

Since ruthenium is a hexagonal crystal, in the ruthenium (0001) plane which is the upper surface of the hexagonal structure, the ruthenium atoms Ru are arranged in six-fold symmetry on the same plane as shown in FIG. 3. In addition, since diamond is a cubic crystal, carbon atoms C are arranged in six-fold symmetry on the same plane in the diamond (111) plane, similarly to ruthenium atoms Ru. Due to such an atomic arrangement, the diamond (111) plane can be heteroepitaxially grown on the ruthenium (0001) plane. In this heteroepitaxial growth, the diamond [111] crystal orientation and the ruthenium [0001] crystal orientation are parallel in a direction perpendicular to the substrate surface, and the diamond [11-2] crystal orientation and the ruthenium [10-10] crystal orientation are parallel in a direction parallel to the substrate surface. Since diamond is a cubic crystal and ruthenium is a hexagonal crystal, the lattice mismatch rate cannot be simply determined from each lattice constant. However, since the diamond (111) plane and the ruthenium (0001) plane each have a six-fold symmetry atomic arrangement on the same plane as described above, the lattice mismatch rate can be obtained. Since the lattice mismatch rate between the diamond (111) plane and the ruthenium (0001) plane is 7.0%, which is lower than 7.1% that is the lattice mismatch rate between the diamond (111) plane and an iridium (111) plane, the single-crystal diamond substrate 1 on which the diamond film 4 having higher quality crystallinity is formed is obtained.

The single-crystal diamond substrate 1 of the embodiment has the diamond film 4 that is a heteroepitaxial film formed on the ruthenium film 3, and a single-crystal diamond substrate and a stack of the ruthenium film 3 and the diamond film 4 having such a configuration have not been reported so far.

Conventionally, as a single-crystal diamond substrate, two types of diamond (100) plane and diamond (111) plane have been used, and a single-crystal diamond substrate of the diamond (111) plane has higher industrial utility value. In the single-crystal diamond substrate 1, the (0001) plane of the ruthenium film 3 is used as a base film, and the (111) plane of the diamond film 4 is heteroepitaxially grown. Platinum and iridium are cubic crystals, whereas ruthenium is a hexagonal crystal. The (0001) plane of a hexagonal crystal having a six-fold symmetry atomic arrangement on the same plane has a characteristic that a crystal is more likely to grow in a direction perpendicular to the (0001) plane (also referred to as a film thickness direction and a C-axis direction) compared with a (111) plane of a cubic crystal having similar atomic arrangement. Therefore, by using ruthenium, which is a hexagonal, rather than platinum and iridium, which are cubic crystals, as a base film, a single-crystal diamond substrate of the (111) plane having higher quality crystallinity can be obtained. Furthermore, since ruthenium is lower in price than platinum and iridium, a single-crystal diamond substrate of the (111) plane can be obtained at a lower cost than in a case where platinum or iridium is used as a base film.

Although the single-crystal diamond substrate has been described above, the stack is not limited to the single-crystal diamond substrate, and may have a stacked structure in which a diamond film that is an epitaxial film and has a surface of the (111) plane is stacked on a ruthenium film.

EXAMPLES

Example 1

In Example 1, a stack of the ruthenium film 3 and the diamond film 4 was produced according to the manufacturing method described in the above embodiment.

The sapphire base material 2 was single-crystal C-plane sapphire ($Al_2O_3$, (0001) plane) having a thickness of 500 μm. The thickness of the ruthenium film 3 was 150 nm.

In a step of manufacturing the single-crystal diamond substrate 1, the ruthenium film 3 oriented in the (0001) plane was formed in a thickness of 150 nm on a surface of the sapphire base material 2 by a sputtering method. The sputtering temperature was 600° C.

Subsequently, the diamond film 4 was formed by heteroepitaxial growth on the ruthenium film 3 by the plasma CVD method using the MPCVD apparatus 10 (see FIG. 2). The heteroepitaxial growth of the diamond film 4 was performed in two steps of nucleation on the ruthenium film 3 and subsequent epitaxial growth of the (111) plane. The thickness of the diamond film 4 was 200 nm at the maximum.

Nucleation was performed by the bias enhanced nucleation (BEN) process. Specifically, in the MPCVD apparatus 10, the temperature was set to 650° C. and plasma was discharged for 30 seconds by applying a bias of −150 V in an atmosphere containing 90% of hydrogen and 10% of methane.

The heteroepitaxial growth of the (111) plane performed subsequently to the nucleation was performed by setting the temperature to 600° C. and discharging plasma for 30 minutes in an atmosphere containing 99.7% of hydrogen and 0.3% of methane. A stack of the ruthenium film 3 and the diamond film 4 was produced by the above steps.

Figure 4:
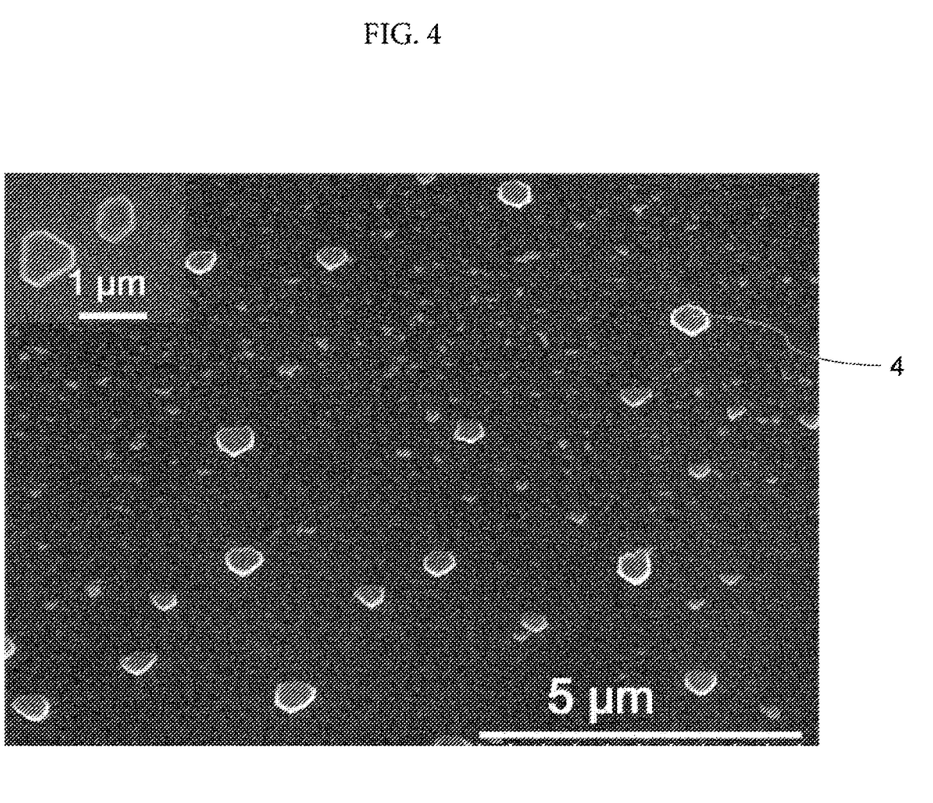
FIG. 4 A surface observation photograph of a single-crystal diamond substrate according to Example 1 taken with an SEM.

The produced stack of the ruthenium film 3 and the diamond film 4 was subjected to surface observation by a scanning electron microscope (SEM). As shown in FIG. 4, the diamond film 4 was formed on the ruthenium film 3, and some crystal grains of the diamond film 4 had an approximately hexagonal contour shape (pseudo hexagon). This indicates that the diamond film 4 has grown in the lateral direction. The average diameter of the diamond film 4 was about 500 nm. Since the crystal grain size of the diamond film 4 can be further increased by appropriately adjusting the process conditions of the heteroepitaxial growth, it is considered that the single-crystal diamond substrate 1 can be obtained by forming the diamond film 4 so as to cover the entire surface of the ruthenium film 3.

Example 2

In Example 2, a sample in which the ruthenium film 3 was formed on the sapphire base material 2 was produced by the same procedure as in Example 1, and analysis by X-ray diffraction was performed.

Figure 5:
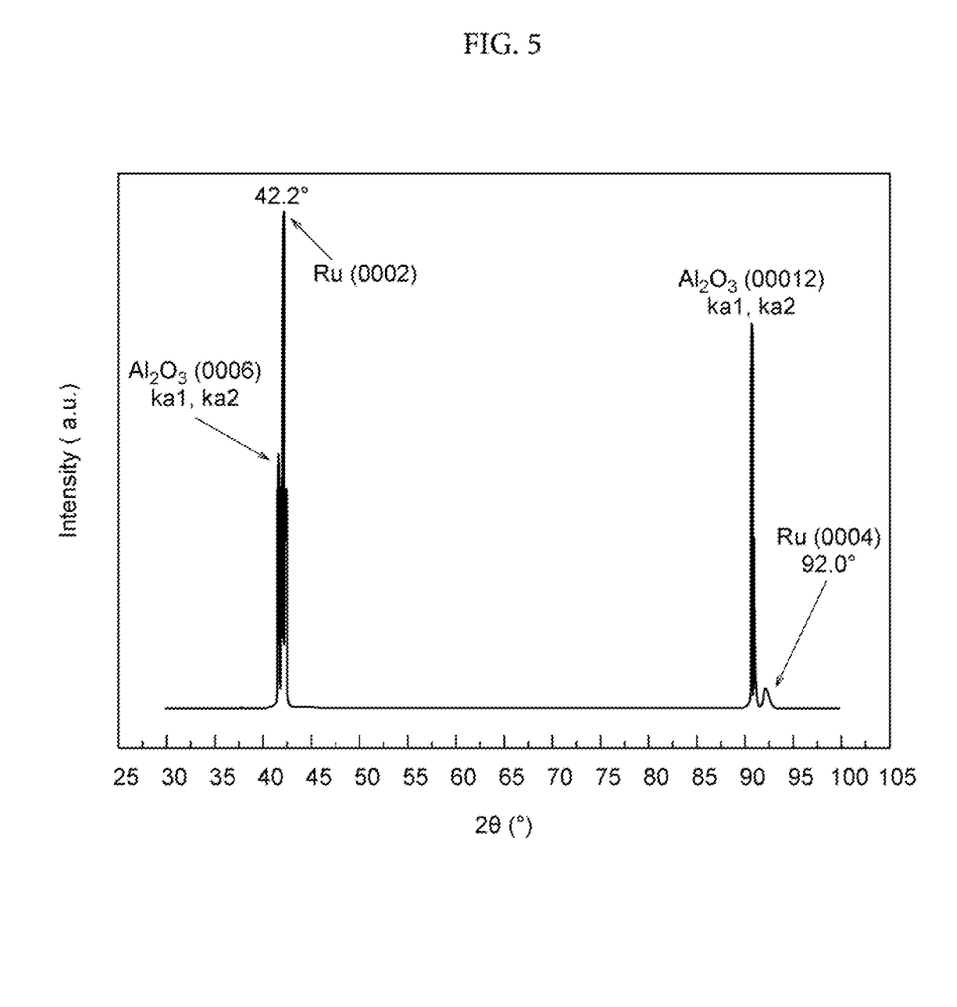
FIG. 5 A graph showing an X-ray diffraction ($2\Theta$ scan) result of a ruthenium film according to Example 2.

FIG. 5 shows a result of performing 2Θ scan of X-ray diffraction on the sample of Example 2. As shown in FIG. 5, the X-ray diffraction pattern showed diffraction peaks at 42.2° and 92.0° corresponding to a Ru (0002) plane and a Ru (0004) plane of the ruthenium film 3, respectively, and at 41.7° and 90.7° corresponding to an $Al_2O_3$ (0006) plane and an $Al_2O_3$ (00012) plane of the sapphire base material 2, respectively. For ruthenium, diffraction peaks corresponding to crystal planes other than the (0002) plane and the (0004) plane, which are planes equivalent to the (0001) plane of ruthenium, were not detected. As a result, it was confirmed that the ruthenium film 3 formed on the sapphire base material 2 was a single crystal.

Figure 6:
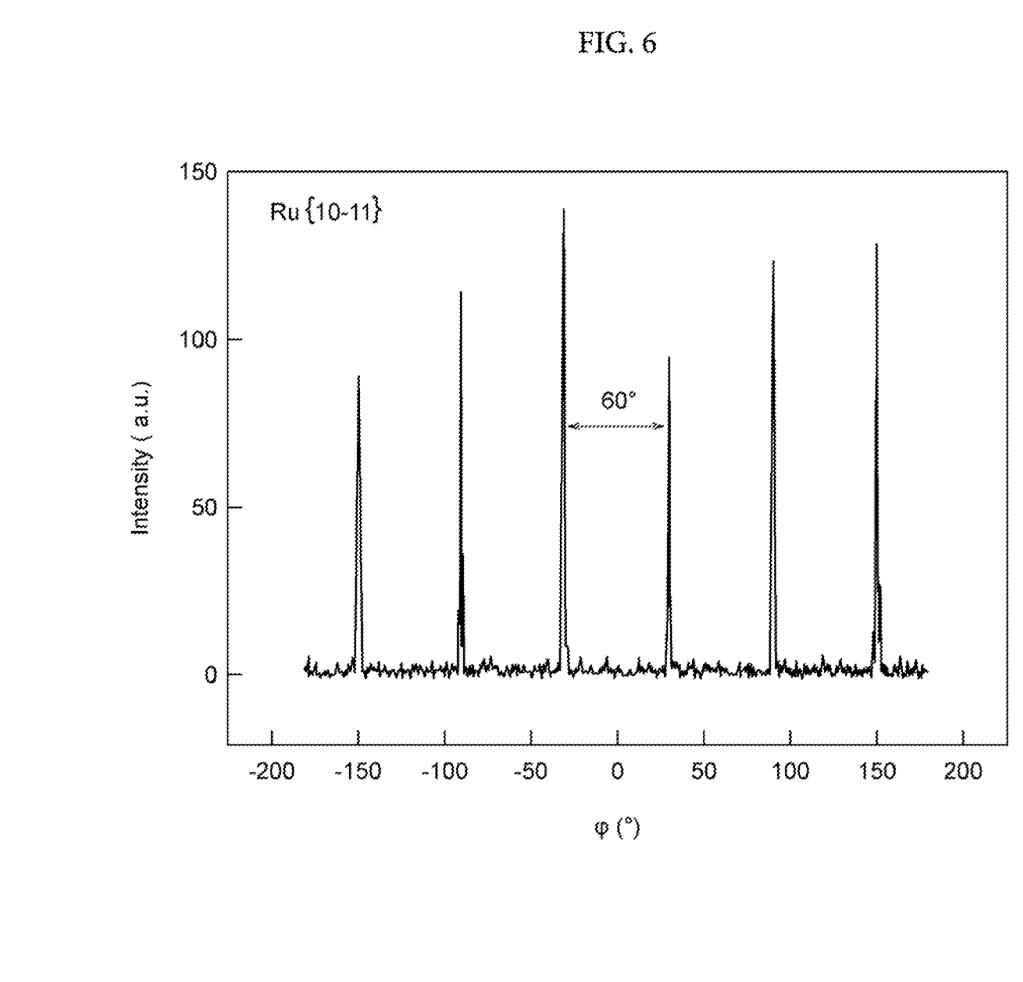
FIG. 6 A graph showing an X-ray diffraction ($\varphi$ scan) result of the ruthenium film according to Example 2.

FIG. 6 shows a result of performing φ scan of X-ray diffraction on the sample of Example 2. As shown in FIG. 6, six reflection peaks of equivalent {10-11} planes were detected at a cycle of 60° by the φ scan. These reflection peaks correspond to the six-fold symmetry structure (see FIG. 3) of the ruthenium (0001) plane which is the upper surface of the hexagonal crystal described in the embodiment.

Figure 7:
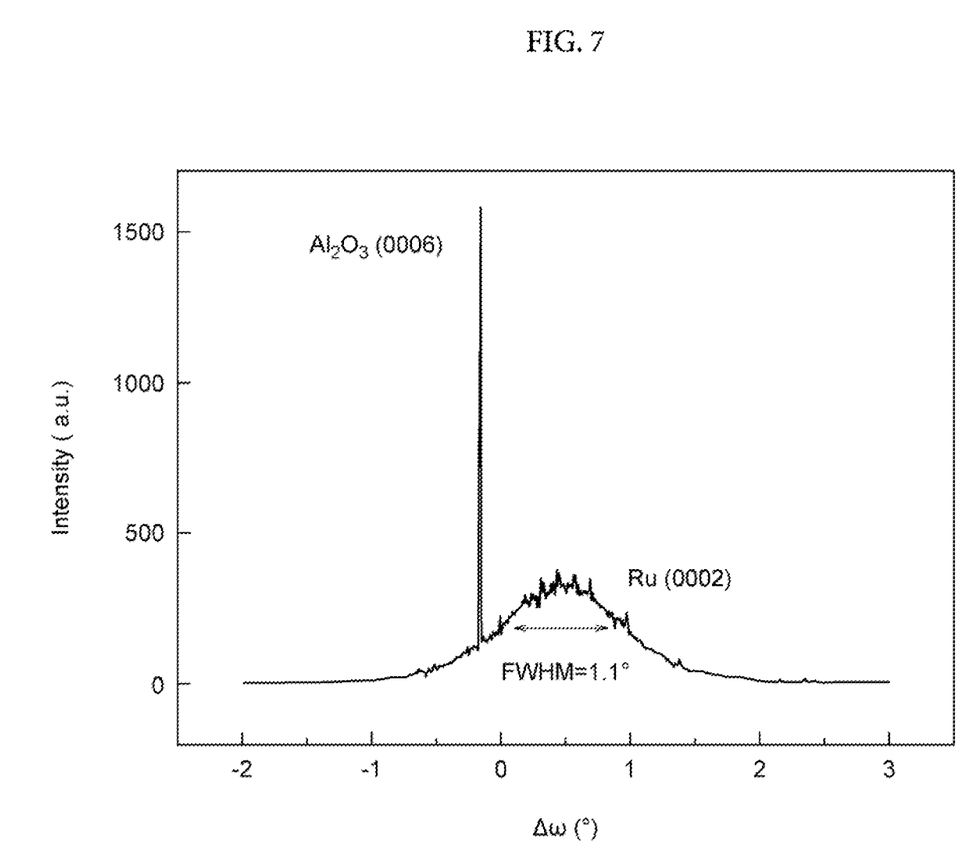
FIG. 7 A graph showing an X-ray diffraction ($\omega$ scan) result of the ruthenium film according to Example 2.

FIG. 7 shows a result of performing ω scan (rocking curve measurement) of X-ray diffraction on the sample of Example 2. It was confirmed that the full width at half maximum (FWHM) of the rocking curve on the Ru (0002) plane was 1.1°.

Example 3

In Example 3, a stack of the ruthenium film 3 and the diamond film 4 produced by the same procedure as in Example 1 was analyzed by an electron back scattered diffraction (EBSD) method.

Figure 8:
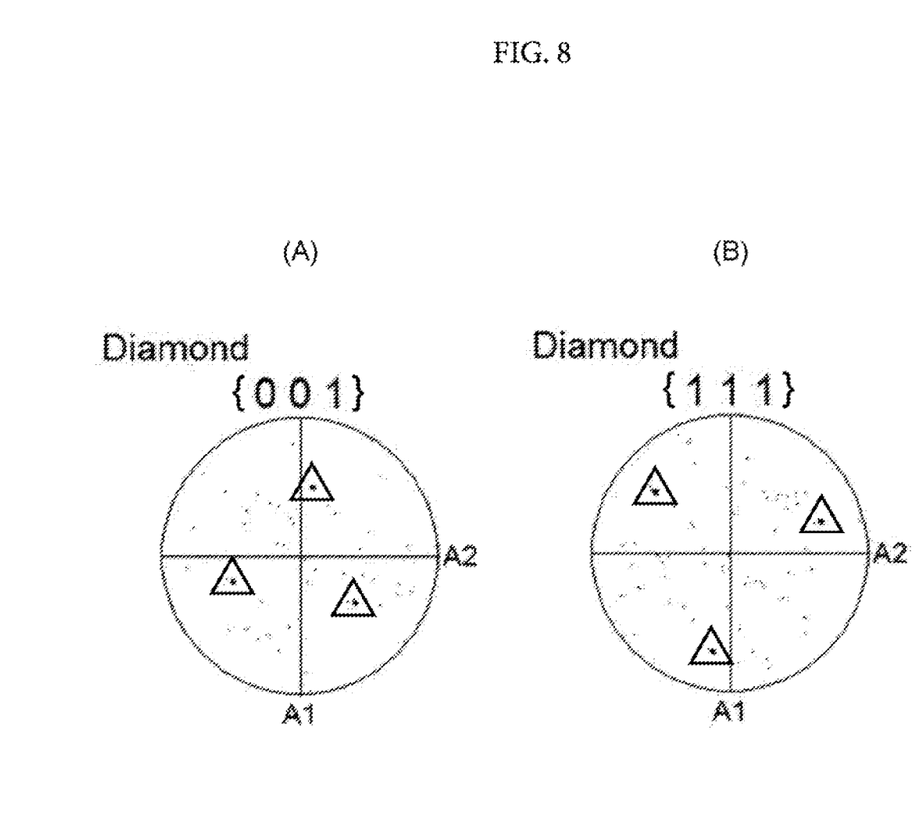
FIG. 8 Pole figures obtained by an EBSD analysis of diamond according to Example 3.
Figure 9:
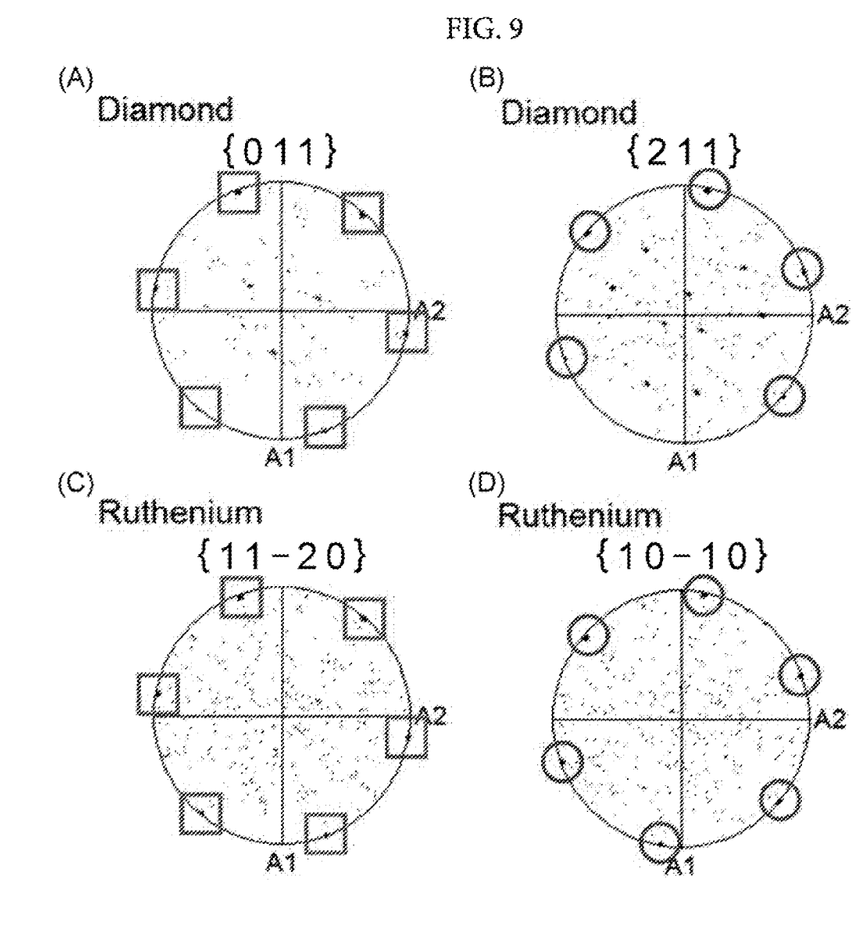
FIG. 9 Pole figures obtained by an EBSD analysis of diamond and ruthenium according to Example 3.

FIGS. 8 and 9 are pole figures in the ND direction (plane normal direction) analyzed by the EBSD method. FIG. 8(A) is a pole figure of the diamond {001} planes, and FIG. 8(B) is a pole figure of the diamond {111} planes. FIG. 9(A) is a pole figure of the diamond {011} planes, FIG. 9(B) is a pole figure of the diamond {211} planes, FIG. 9(C) is a pole figure of the ruthenium {11-20} planes, and FIG. 9(D) is a pole figure of the ruthenium {10-10} planes. The pole figures shown in FIGS. 9(A) to 9(D) were all acquired simultaneously in order to specify the orientation of epitaxial growth.

As shown in FIG. 8(A), the reflection of the diamond {001} planes was strongly detected at three positions surrounded by Δ. As shown in FIG. 8(B), the reflection of the diamond {111} planes was strongly detected at three positions surrounded by Δ.

As shown in FIG. 9(A), the reflection of the diamond {011} planes was strongly detected at six positions surrounded by □ on the outermost peripheral portion. As shown in FIG. 9(B), the reflection of the diamond {211} planes was strongly detected at five positions surrounded by ○ on the outermost peripheral portion.

The reason why the number of reflection positions of the diamond {211} planes at the outermost peripheral portion was 5 instead of 6 is considered to be that there was a slight inclination of the crystal plane at the place where the EBSD analysis was performed. From the pole figures of FIGS. 8(A), 8(B), 9(A), and 9(B), it was confirmed that the diamond film 4 is a single crystal and is oriented in the (111) plane.

As shown in FIG. 9(C), the reflection of the ruthenium {11-20} planes was strongly detected at six positions surrounded by □ on the outermost peripheral portion. As shown in FIG. 9(D), the reflection of the ruthenium {10-10} planes was strongly detected at six positions surrounded by ○ on the outermost peripheral portion.

The six positions surrounded by □ where the reflection of the diamond {011} planes was strongly detected (FIG. 9(A)) and the six positions surrounded by □ where the reflection of the ruthenium {11-20} planes was strongly detected (FIG. 9(C)) were located at corresponding positions on the pole figures. In addition, the five positions surrounded by ○ where the reflection of the diamond {211} planes was strongly detected (FIG. 9(B)) and five positions among the six positions surrounded by ○ where the reflection of the ruthenium {10-10} planes was strongly detected (FIG. 9(D)) were located at corresponding positions on the pole figures. This indicates that the crystal planes of the six equivalent {11-20} columnar planes in the hexagonal structure with the six-fold symmetry structure of the ruthenium (0001) plane as the upper surface and the orientations thereof are parallel to the crystal planes of the six equivalent {011} planes which are columnar planes in the hexagonal columnar structure with the six-fold symmetry structure of the diamond (111) plane as the upper surface, and the orientations coincide with each other. A similar relationship holds for the six equivalent {10-10} planes of ruthenium and the six equivalent {211} planes of diamond.

The analysis result by the EBSD method in Example 3 showed that, with respect to the crystal orientations of the diamond film 4 and the ruthenium film 3 of the produced stack of the ruthenium film 3 and the diamond film 4, the diamond [111] crystal orientation and the ruthenium [0001] crystal orientation matched, and the diamond [11-2] crystal orientation and the ruthenium [10-10] crystal orientation matched, and it could be confirmed that the diamond film 4 was heteroepitaxially grown on the ruthenium film 3.

REFERENCE SIGNS LIST

1: Single-crystal diamond substrate
2: Sapphire base material
3: Ruthenium film
4: Diamond film
10: MPCVD apparatus
11: Chamber
12: DC voltage applicable sample stage
13: Magnetron generator
14: Waveguide converter
15: Waveguide
16: Temperature measuring device
17: Raw material gas supply path
18: Raw material gas exhaust path
19: Induction heating type coil
20: Antenna electrode
21: Plasma ball

The invention claimed is:

1. A stack comprising:
a ruthenium film; and a diamond film that is an epitaxial film formed on the ruthenium film, wherein
a crystal plane of a surface of the ruthenium film is a (0001) plane, and a crystal plane of a surface of the diamond film is a (111) plane.

2. A single-crystal diamond substrate comprising:
a ruthenium film; and a diamond film that is an epitaxial film formed on the ruthenium film, wherein
a crystal plane of a surface of the ruthenium film is a (0001) plane, and a crystal plane of a surface of the diamond film is a (111) plane.

3. The single-crystal diamond substrate according to claim 2, wherein the ruthenium film is formed on sapphire.

4. The single-crystal diamond substrate according to claim 2, wherein the ruthenium film is formed on strontium titanate or magnesium oxide.

* * * * *